(12) United States Patent
Yoshida

(10) Patent No.: US 6,444,585 B1
(45) Date of Patent: Sep. 3, 2002

(54) METHOD FOR MANUFACTURING SEMICONDUCTOR DEVICE CAPABLE OF EXPELLING ARGON GAS

(75) Inventor: Masayuki Yoshida, Tokyo (JP)

(73) Assignee: NEC Corporation, Tokyo (JP)

(*) Notice: Subject to any disclaimer, the term of this patent is extended or adjusted under 35 U.S.C. 154(b) by 60 days.

(21) Appl. No.: 09/716,287

(22) Filed: Nov. 21, 2000

(30) Foreign Application Priority Data

Nov. 22, 1999  (JP) ............................................ 11-332003

(51) Int. Cl.[7] ............................................ H01L 21/302
(52) U.S. Cl. ........................ 438/706; 438/715; 438/720
(58) Field of Search ................................ 438/706, 710, 438/712, 714, 715, 720

(56) References Cited

U.S. PATENT DOCUMENTS

| | | | | |
|---|---|---|---|---|
| 5,254,872 A | * | 10/1993 | Yoda et al. ................. | 257/751 |
| 5,360,765 A | * | 11/1994 | Konda et al. ............. | 204/192.1 |
| 6,002,175 A | * | 12/1999 | Maekawa .................... | 257/759 |
| 6,074,479 A | * | 6/2000 | Adachi et al. ............. | 117/204 |
| 6,329,284 B2 | * | 12/2001 | Maekawa .................... | 438/633 |

FOREIGN PATENT DOCUMENTS

| | | |
|---|---|---|
| JP | 410621 | 1/1992 |
| JP | 8288219 | 11/1996 |
| JP | 11243082 | 9/1999 |

* cited by examiner

*Primary Examiner*—Benjamin L. Utech
*Assistant Examiner*—Kin-Chan Chen
(74) *Attorney, Agent, or Firm*—Young & Thompson

(57) ABSTRACT

In a method for manufacturing a semiconductor device, a first conductive layer is formed on a semiconductor substrate. Then, a plasma etching process using Ar ions is performed upon the first conductive layer to remove natural oxide from the first conductive layer. Then, a heating process at a temperature higher than about 650° C. is performed upon the first conductive layer to expel Ar atoms from the first conductive layer. Finally, a second conductive layer is formed by a sputtering process on the first conductive layer.

4 Claims, 6 Drawing Sheets

METHOD FOR MANUFACTURING SEMICONDUCTOR DEVICE CAPABLE OF EXPELLING ARGON GAS

BACKGROUND OF THE INVENTION

1. Field of the Invention

The present invention relates to a method for manufacturing a semiconductor device by a plasma etching process using argon (Ar) ions.

2. Description of the Related Art

In a prior art method for manufacturing a semiconductor device, a first conductive layer is formed on a semiconductor substrate. Then, a plasma etching process using Ar ions is performed upon the first conductive layer to remove natural oxide from the first conductive layer. Finally, a second conductive layer is formed by a sputtering process on the first conductive layer. This will be explained later in detail.

In the above-described semiconductor device, if a heating process at a temperature such as 840° C. is carried out at a post stage, argon atoms immersed in the first conductive layer are moved to an interface between the first and second conductive layers. As a result, the contact characteristics between the first and second conductive layers are deteriorated. At worst, the second conductive layer is peeled from the first conductive layer, and therefore, the second conductive layer is electrically separated from the first conductive layer. This would degrade the performance of the semiconductor device.

Note that JP-A-4-10621 discloses a radio-frequency (RF) plasma etching process using halogen fluoride diluted by Ar gas for silicon nitride, and JP-A-11-243082 discloses an RF plasma etching process using a mixture of fluorine gas and Ar gas for silicon oxide. However, neither one suggests the expulsion of Ar atoms immersed into semiconductor devices.

SUMMARY OF THE INVENTION

It is an object of the present invention to expel Ar atoms from a semiconductor device to improve the contact characteristics between two conductive layers, one of the conductive layers being formed by a sputtering process.

According to the present invention, in a method for manufacturing a semiconductor device, a first conductive layer is formed on a semiconductor substrate. Then, a plasma etching process using Ar ions is performed upon the first conductive layer to remove natural oxide from the first conductive layer. Then, a heating process at a temperature higher than about 650° C. is performed upon the first conductive layer to expel Ar atoms from the first conductive layer. Finally, a second conductive layer is formed by a sputtering process on the first conductive layer.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art method for manufacturing a semiconductor device will be explained with reference to FIGS. 1A through 1C.

Figure 1A:
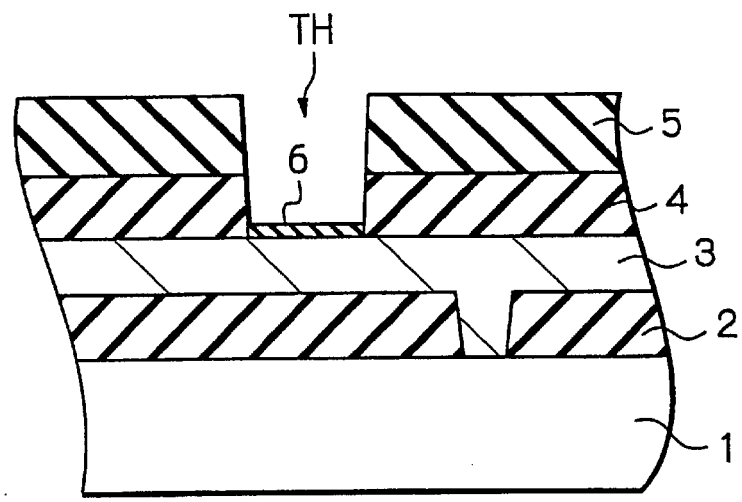
FIGS. 1A through 1C are cross-sectional views for explaining a prior art method for manufacturing a semiconductor device.

First, referring to FIG. 1A, a silicon oxide layer 2 is formed on a silicon substrate 1 where active regions are already formed. Then, the silicon oxide layer 2 is perforated by a photolithography and etching process. Then, a conductive layer 3 made of aluminum or refractory metal such as WSi is deposited by a sputtering process or the like. Then, a boron-included phosphor-silicated silicon glass (BPSG) layer 4 and a silicon nitride layer 5 are sequentially deposited by a chemical vapor deposition (CVD) process. Then, the silicon nitride layer 5 and the BPSG layer 4 are perforated by a photolithography and etching process, so that a throughhole TH is formed therein. In this case, since the conductive layer 3 is oxidized, a very thin natural oxide layer 6 is formed on the conductive layer 3.

Figure 1B:
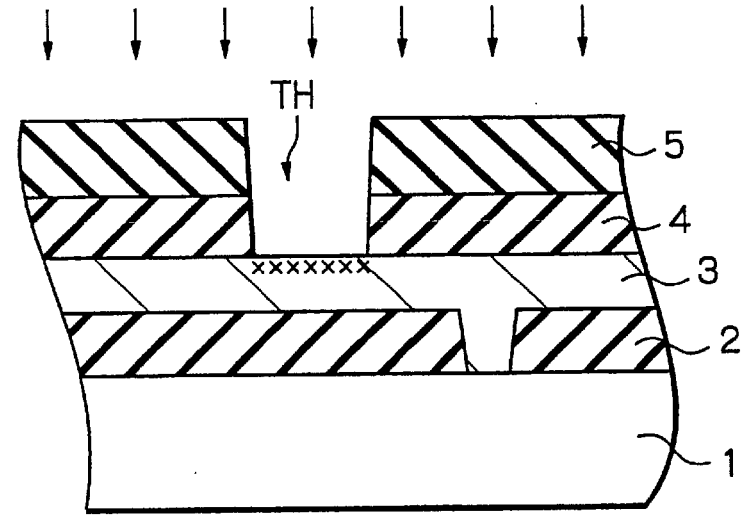

Next, referring to FIG. 1B, an RF plasma etching process using Ar ions is performed upon the natural oxide layer 6 to remove it. As a result, some argon ions are immersed into the conductive layer 3 as indicated by X.

Figure 1C:
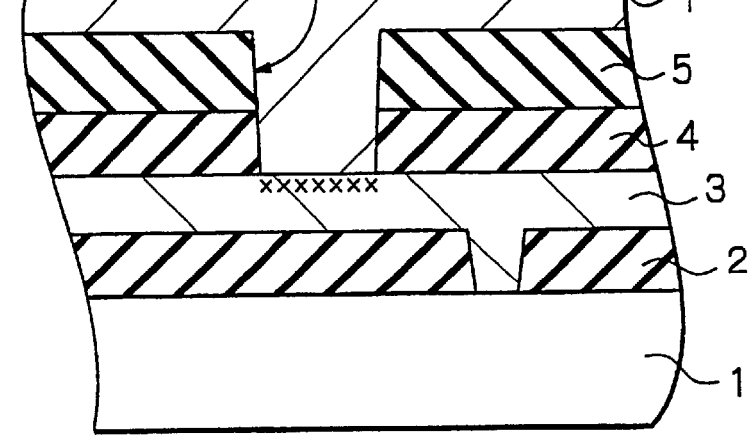
Figure 2:
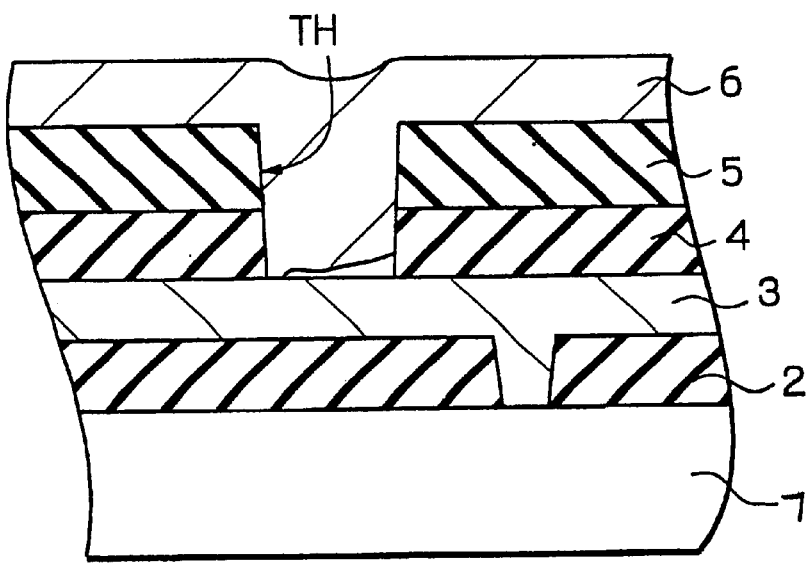
FIG. 2 is a cross-sectional view for explaining a problem created in the method as illustrated in FIGS. 1A through 1C.

Finally, referring to FIG. 1C, a conductive layer 7 made of aluminum or refractory metal such as WSi is deposited on the silicon nitride layer 5 and the throughhole TH by a sputtering process or the like, so that the conductive layer 7 is in contact with the conductive layer 3 at the throughhole TH.

In the semiconductor device manufactured as illustrated in FIGS. 1A, 1B and 1C, if a heating process at a temperature such as 840° C. is carried out at a post stage, argon atoms immersed in the conductive layer 3 are moved to an interface between the conductive layers 3 and 7. As a result, the contact characteristics between the conductive layers 3 and 7 are deteriorated. At worst, the conductive layer 7 is peeled from the conductive layer 3, and therefore, the conductive layer 7 is electrically separated from the conductive layer 3. This would degrade the performance of the semiconductor device.

An embodiment of the method for manufacturing a semiconductor device according to the present invention will be explained next with reference to FIGS. 3A through 3D.

Figure 3A:
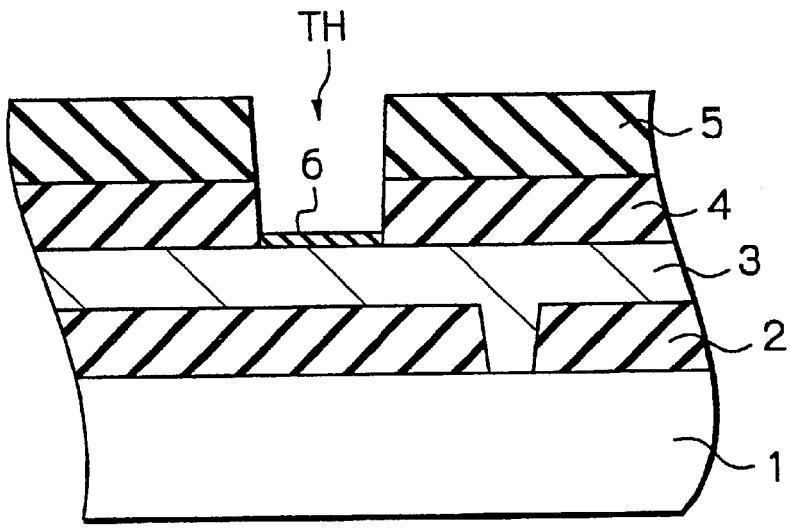
FIGS. 3A through 3D are cross-sectional views for explaining an embodiment of the method for manufacturing a semiconductor device according to the present invention.

First, referring to FIG. 3A, in the same way as in FIG. 1A, a silicon oxide layer 2 is formed on a silicon substrate 1 where active regions are already formed. Then, the silicon oxide layer 2 is perforated by a photolithography and etching process. Then, a conductive layer 3 made of aluminum or refractory metal such as WSi is deposited by a sputtering process or the like. Then, a BPSG layer 4 and a silicon nitride layer 5 are sequentially deposited by a CVD process. Then, the silicon nitride layer 5 and the BPSG layer 4 are perforated by a photolithography and etching process, so that a throughhole TH is formed therein. In this case, since the conductive layer 3 is oxidized, a very thin natural oxide layer 6 is formed on the conductive layer 3.

Figure 3B:
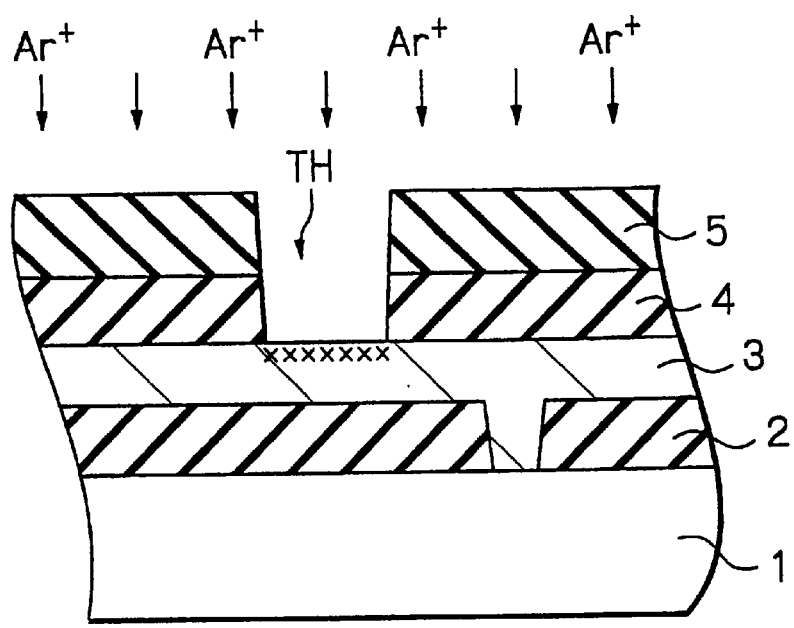

Next, referring to FIG. 3B, in the same way as in FIG. 1B, an RF plasma etching process using Ar ions is performed upon the natural oxide layer 6 to remove it. As a result, some argon ions are immersed into the conductive layer 3 as indicated by X.

Figure 3C:
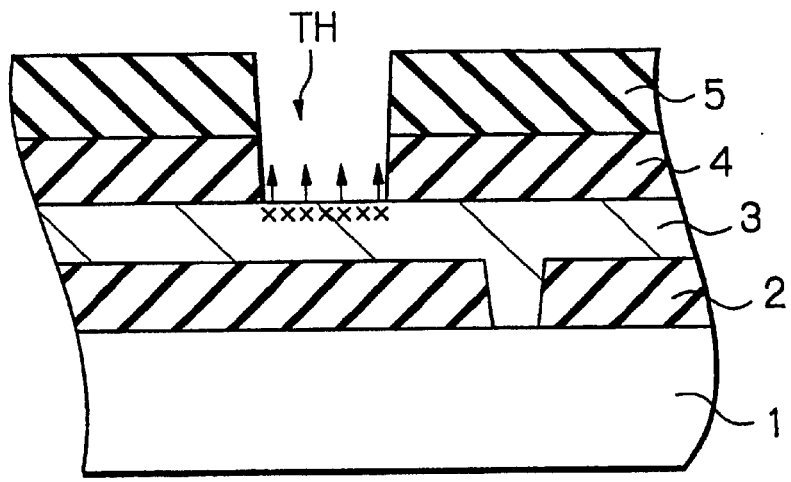

Next, referring to FIG. 3C, a heating process at a temperature higher than about 650° C. is carried out. This will be explained later in detail. As a result, the argon atoms immersed in the conductive layer 3 are effectively expelled therefrom as indicated by arrows.

Figure 3D:
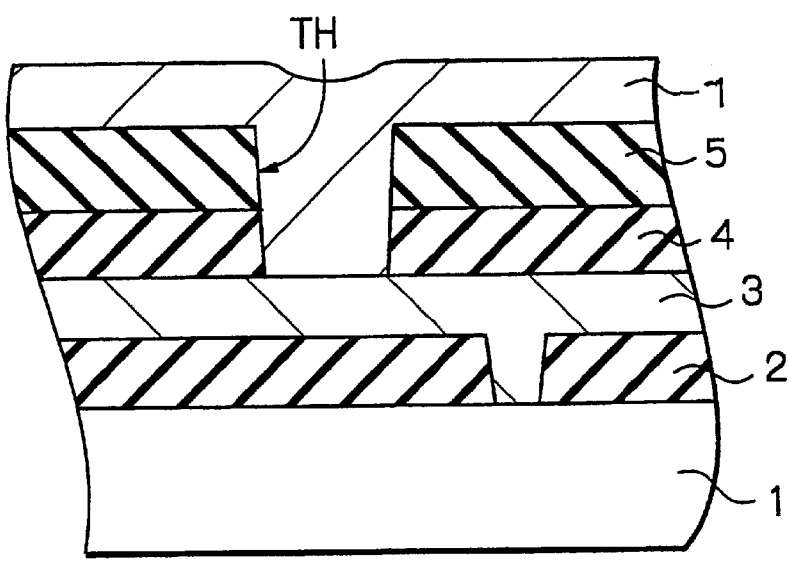

Finally, referring to FIG. 3D, in the same way as in to FIG. 1C, a conductive layer 7 made of aluminum or refractory metal such as WSi is deposited on the silicon nitride layer 5 and the throughhole TH by a sputtering process or the like, so that the conductive layer 7 is in contact with the conductive layer 3 at the throughhole TH.

In the semiconductor device manufactured as illustrated in FIGS. 3A, 3B, 3C and 3D, if a heating process at a temperature such as 840° C. is carried out at a post stage, since no argon atoms are immersed in the conductive layer 3, the contact characteristics between the conductive layers 3 and 7 are not deteriorated. In addition, the conductive layer 7 is never peeled from the conductive layer 3, and therefore, the conductive layer 7 is never electrically separated from the conductive layer 3. This would not degrade the performance of the semiconductor device.

Figure 4:
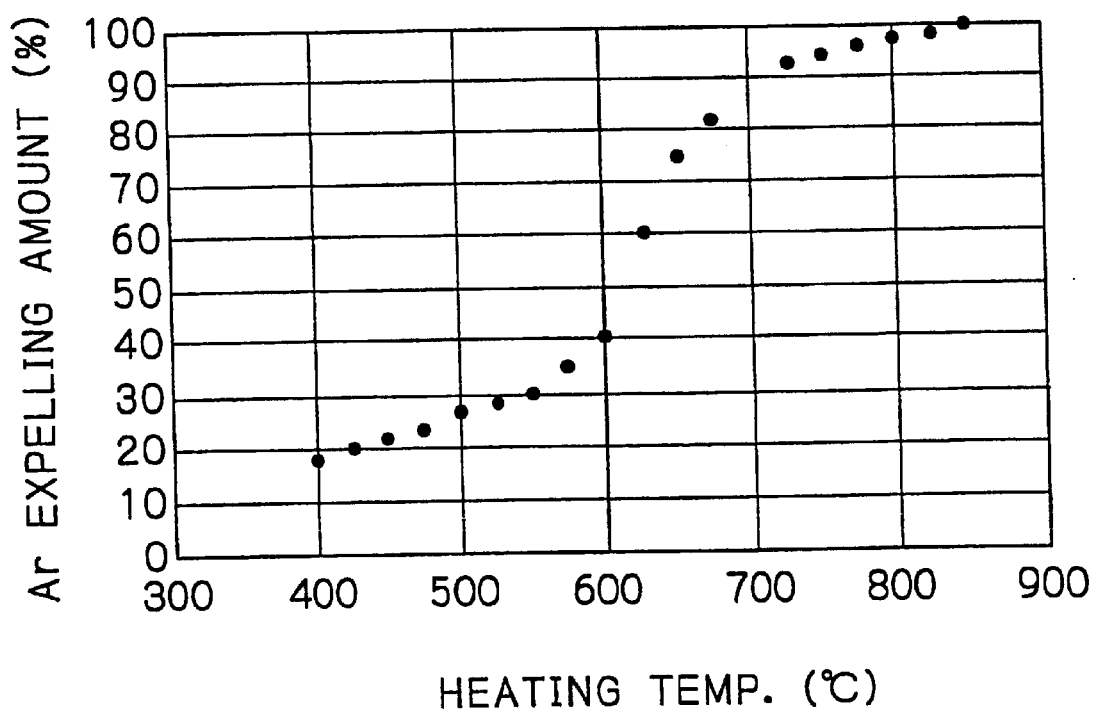
FIG. 4 is a graph for showing the expelling characteristics of argon atoms in FIG. 3C.

The expelling characteristics of argon atoms from the conductive layer 3 by the heating process in FIG. 3C are shown in FIG. 4 where the Ar expelling amount at 850° C. for 30 seconds under a high vacuum state of $1.0 \times 10^{-6}$ Torr ($=1.33 \times 10^{-4}$ Pa) is defined as 100%. As shown in FIG. 4, when the heating temperature is about 650° C., the Ar expelling amount is about 70%, and when the heating temperature is about 700° C., the Ar expelling amount is about 90%. Therefore, the heating temperature in FIG. 3C is preferably higher than about 650° C.

Figure 5:
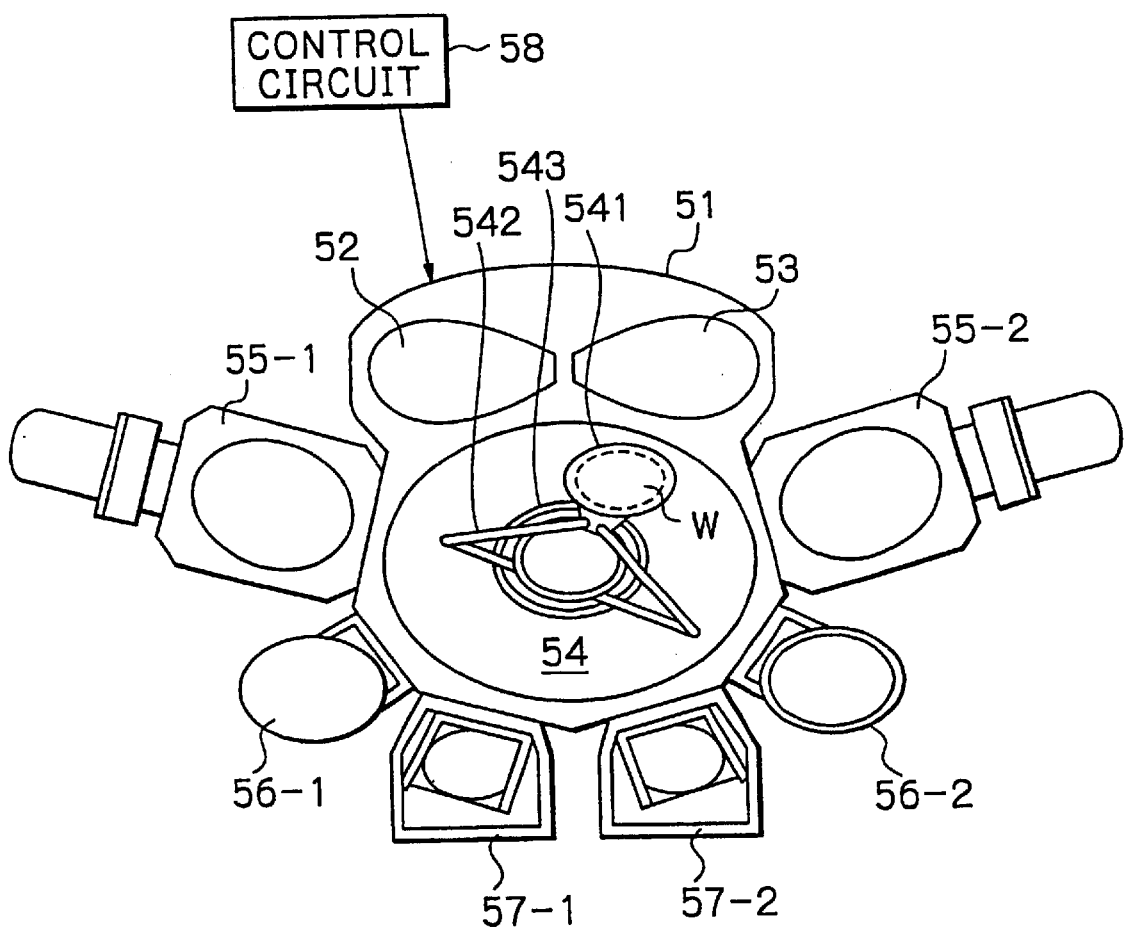
FIG. 5 is a diagram illustrating an apparatus for carrying out the method as illustrated in FIGS. 3A, 3B, 3C and 3D.

In FIG. 5, which illustrates an apparatus for carrying out the method as illustrated in FIGS. 3A, 3B, 3C and 3D, reference numeral 51 designates a vacuum unit where an RF plasma etching chamber 52, a cooling camber 53 and a separation chamber 54 are provided.

Also, a plate 541 for mounting a wafer W, expansible arms 542 for supporting the plate 541, and a pivot pedestal 543 for pivotally supporting the arms 542 are provided in the separation chamber 54.

Further, sputtering chambers 55-1 and 55-2, heating chambers 56-1 and 56-2 and loading chambers 57-1 and 57-2 are connected to the vacuum unit 51. The heating chambers 56 includes a lamp annealer.

Note that entire apparatus of FIG. 5 is in one vacuum atmosphere.

Also, the apparatus of FIG. 5 is controlled by a control circuit 58 which may consist of a microcomputer.

The operation of the apparatus of FIG. 5 will be explained below.

First, a package including wafers W, in which layers 2, 3, 4 and 5 are already formed on a silicon substrate 1, is set in the loading chamber 57-1, and one of the wafers W is moved by the plate 541 and the arms 542 from the loading chamber 57-1 to the RF plasma etching chamber 52. After that, the vacuum chamber 51 is vacuumized at about $1.0 \times 10^{-6}$ Torr ($=1.33 \times 10^{-4}$ Pa).

Next, in the RF plasma etching chamber 52, an RF plasma etching process using Ar ions is carried out to remove a natural oxide layer 6 from the conductive layer 3.

Next, one of the wafers W is moved by the plate 541 and the arms 542 from the RF plasma etching chamber 52 to the heating chamber 56-1. Then, a heating process using the lamp annealing operation is carried out to a temperature higher than 650° C. for 30 seconds to expel the Ar atoms from the conductive layer 3.

Next, one of the wafers W is moved by the plate 541 and the arms 542 from the heating chamber 56-1 to the sputtering chamber 55-1. Then, a sputtering process is carried out to form a conductive layer 7.

Finally, one of the wafers W is moved by the plate 541 and the arms 542 from the sputterning chamber 55-1 to the loading chamber 57-1.

As explained hereinabove, according to the present invention, since Ar atoms are sufficiently expelled from an underlying conductive layer before an overlying conductive layer is formed by a sputtering process, the contact characteristics between the two conductive layers can be improved, which would not degrade the performance of semiconductor devices.

What is claimed is:

1. A method for manufacturing a semiconductor device, comprising the steps of:

forming a first conductive layer on a semiconductor substrate;

performing a plasma etching process using Ar ions upon said first conductive layer to remove natural oxide from said first conductive layer; and performing a heating process at a temperature higher than about 650° C. upon said first conductive layer to expel Ar atoms from said first conductive layer, after said plasma etching process is performed; and forming a second conductive layer by a sputtering process on said first conductive layer, after said heating process is performed.

2. The method as set forth in claim 1, wherein said plasma etching process performing step, said heating process performing step and said second conductive forming step are carried out within one apparatus that can be vacuumized.

3. The method as set forth in claim 1, wherein said plasma etching process is a radio-frequency plasma etching process.

4. The method as set forth in claim 1, wherein said heating process is carried out at a temperature higher than about 700° C.

* * * * *